United States Patent
Hosking

(10) Patent No.: US 7,706,421 B2
(45) Date of Patent: Apr. 27, 2010

(54) TEMPERATURE SENSING DEVICE PATTERNED ON AN ELECTRO-OPTIC TRANSDUCER DIE

(75) Inventor: Lucy G. Hosking, Santa Cruz, CA (US)

(73) Assignee: Finisar Corporation, Sunnyvale, CA (US)

( * ) Notice: Subject to any disclaimer, the term of this patent is extended or adjusted under 35 U.S.C. 154(b) by 349 days.

(21) Appl. No.: 11/110,580

(22) Filed: Apr. 20, 2005

(65) Prior Publication Data

US 2006/0239315 A1  Oct. 26, 2006

(51) Int. Cl.
   *H01S 3/04* (2006.01)
(52) U.S. Cl. .......................................... 372/36; 372/34
(58) Field of Classification Search ................ 372/34, 372/36; 250/349; 438/16, 7
   See application file for complete search history.

(56) References Cited

U.S. PATENT DOCUMENTS

| | | | |
|---|---|---|---|
| 4,604,753 A | | 8/1986 | Sawai |
| 5,706,302 A | | 1/1998 | Shimizu |
| 5,832,015 A | | 11/1998 | Goto et al. |
| 6,126,311 A | * | 10/2000 | Schuh ........................... 374/21 |
| 6,253,097 B1 | * | 6/2001 | Aronow et al. ............... 600/310 |
| 6,290,388 B1 | * | 9/2001 | Saul et al. ...................... 374/44 |
| 6,496,524 B2 | * | 12/2002 | Miyokawa et al. ............ 372/36 |
| 6,501,774 B2 | * | 12/2002 | Kuwahara et al. ............. 372/32 |
| 6,546,030 B2 | * | 4/2003 | Sasao ............................ 372/36 |
| 6,807,206 B2 | | 10/2004 | Tsukiji et al. |
| 6,934,448 B2 | * | 8/2005 | Akashi et al. ................. 385/49 |
| 7,131,766 B2 | * | 11/2006 | Sultan et al. .................. 374/29 |
| 7,154,372 B2 | * | 12/2006 | Vanha et al. ................... 338/42 |
| 7,215,891 B1 | * | 5/2007 | Chiang et al. ............... 398/137 |
| 2002/0105045 A1 | * | 8/2002 | Kawamura ................... 257/467 |
| 2002/0167065 A1 | * | 11/2002 | Graf et al. .................... 257/467 |
| 2003/0157741 A1 | | 8/2003 | Oohata et al. |
| 2006/0239314 A1 | | 10/2006 | Hosking |

OTHER PUBLICATIONS

Hosking, Lucy G., Electro-Optic Transducer Die Including A Temperature Sensing PN Junction Diode, U.S. Appl. No. 11/110,112, filed Apr. 20, 2005.

Hosking, Lucy G., Optical Transmit Assembly Including Thermally Isolated Laser, Temperature Sensor and Temperature Driver, U.S. Appl. No. 11/110,236, filed Apr. 20, 2005.

* cited by examiner

*Primary Examiner*—Minsun Harvey
*Assistant Examiner*—Tuan N. Nguyen
(74) *Attorney, Agent, or Firm*—Workman Nydegger

(57) ABSTRACT

An optical transmit assembly having a temperature sensor patterned on an electro-optic transducer die. Due to the close proximity of the electro-optic transducer junction and the temperature sensor, the temperature sensor more accurately measures the temperature of the electro-optic transducer junction. This permits for more refined control of the frequency characteristics of optical light emitted by the electro-optic transducer junction since the emitted optical frequencies of most electro-optic transducers are heavily temperature dependent.

16 Claims, 2 Drawing Sheets

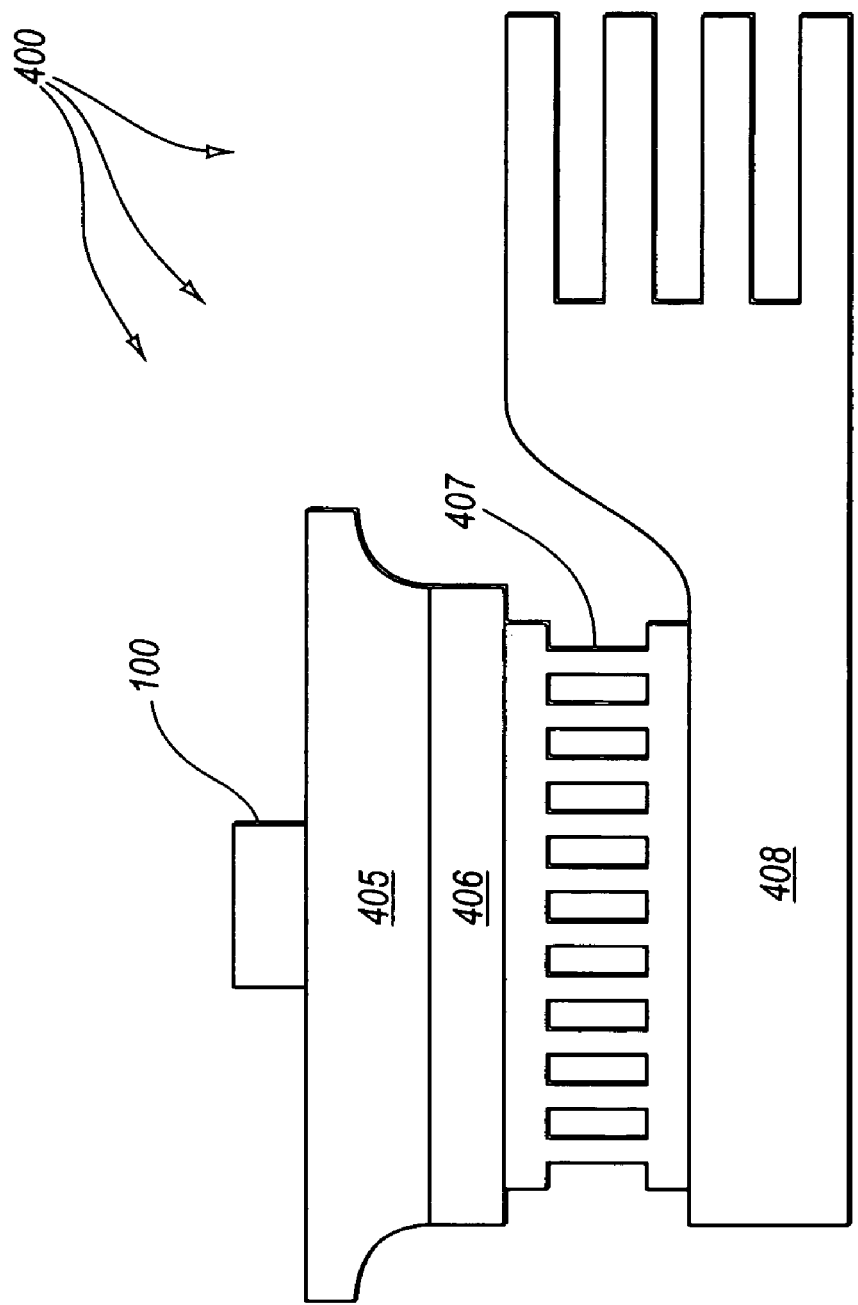

TEMPERATURE SENSING DEVICE PATTERNED ON AN ELECTRO-OPTIC TRANSDUCER DIE

BACKGROUND OF THE RELATED ART

1. The Field of the Invention

The present invention relates generally to optical transmitters. More specifically, the present invention relates to optical transmit assemblies in which a temperature sensing device is patterned on an electro-optic transducer die.

2. Background and Related Art

Computing and networking technology have transformed our world. As the amount of information communicated over networks has increased, high speed transmission has become ever more critical. Many high speed data transmission networks rely on optical transceivers and similar devices for facilitating transmission and reception of digital data embodied in the form of optical signals over optical fibers. Optical networks are thus found in a wide variety of high speed applications ranging from as modest as a small Local Area Network (LAN) to as grandiose as the backbone of the Internet.

Typically, data transmission in such networks is implemented by way of an optical transmitter (also referred to as an electro-optic transducer), such as a laser or Light Emitting Diode (LED). The electro-optic transducer emits light when current is passed through it, the intensity of the emitted light being a function of the current magnitude being passed through the electro-optic transducer. Information is conveyed optically by transmitting different optical intensities. The emitted light is more specifically emitted by the PN junction of the electro-optic transducer.

The optical emission frequencies from the PN junction of the electro-optic transducer have strong temperature dependencies that can seriously affect performance, depending on the application. For example, in Dense Wavelength Division Multiplexed (DWDM) laser applications, different optical channels are transmitted simultaneously, each optical channel having a tight frequency range that the corresponding optical signal should stay within. Any variance outside of the frequency range could cause inter-signal interference, seriously increasing the error rate of the transmission. Thus, in DWDM laser applications, it is critical that the laser's transmitted frequency be tightly controlled. Nevertheless, the frequency characteristics of the emitted light from the PN laser diode junction are heavily temperature-dependent. Although DWDM has been discussed here, there are a wide variety of applications in which it may be desirable to accurately control the temperature of the electro-optic transducer junction.

The temperature control of the electro-optic transducer junction typically relies on a temperature feedback system. Specifically, a temperature sensor is provided in proximity to the electro-optic transducer junction. Depending on the sensed temperature, a temperature driver then heats or cools the temperature sensor as appropriate until the temperature sensor detects a temperature within an acceptable temperature range. The aim here is that by tightly controlling the temperature of the temperature sensor, the temperature of the proximate electro-optic transducer driver junction will also be tightly controlled.

However, the temperature sensor and the electro-optic transducer junction cannot occupy the same space at the same time. Therefore, the temperature sensor, though relatively close to the electro-optic transducer junction, is still placed some finite distance from the electro-optic transducer junction. There will thus be some finite amount of thermal resistance between the temperature sensor and the electro-optic transducer junction.

The temperature of the electro-optic transducer junction may vary significantly as the electro-optic transducer itself generates heat. Furthermore, the temperature sensor may also generate heat. In addition, the temperature sensor and the electro-optic transducer may dynamically exchange heat with other surrounding components and the environment. Thus, due to the thermal resistance between the temperature sensor and the electro-optic transducer, there will be some error between the temperature sensed by the temperature sensor and the actual temperature of the electro-optic transducer junction. In this way, even very tight control of the temperature of the temperature sensor, will not necessarily result in tight control of the temperature of the electro-optic transducer junction.

Accordingly, what would be advantageous are mechanisms in which there is tighter control of the temperature of the electro-optic transducer junction.

BRIEF SUMMARY OF THE INVENTION

The foregoing problems with the prior state of the art are overcome by the principles of the present invention, which relate to an optical transmit assembly that includes an electro-optic transducer with a temperature sensor patterned on a surface of the electro-optic transducer. Due to the extremely close proximity of the electro-optic transducer and temperature sensor, the thermal resistance between the electro-optic transducer junction and the temperature sensor is reduced. Accordingly, the temperature detected by the temperature sensor more closely tracks the actual temperature of the electro-optic transducer junction.

The highly accurate temperature measurements allow for tight temperature control of the electro-optic transducer thereby more tightly controlling the frequency of the optical emissions from the electro-optic transducer PN junction. The tight control of frequency, in turn, reduces the risk of inter-signal interference in DWDM communication systems, and may even permit the frequency span of a given optical channel in a frequency division multiplexed environment to be even further reduced in future standards, thereby potentially increasing the possible optical data rate.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depicts only an example embodiment of the invention and is not therefore to be considered to be limiting of its scope, the invention will be described and explained with additional specificity and detail through the use of the accompanying drawing in which:

FIG. 4 illustrates a profile view of the electro-optic transducer of FIG. 1 or 2, mounted on a substrate and further being coupled to a temperature driver and heat sink.

DETAILED DESCRIPTION OF THE PREFERRED EMBODIMENTS

The principles of the present invention relate to an optical transmit assembly that includes a temperature sensor patterned on a surface of the electro-optic transducer die. While the optical transmit assembly will be described in some detail, the optical transmit assembly is described by way of illustration only, and not by way of restricting the scope of the invention.

Figure 1:
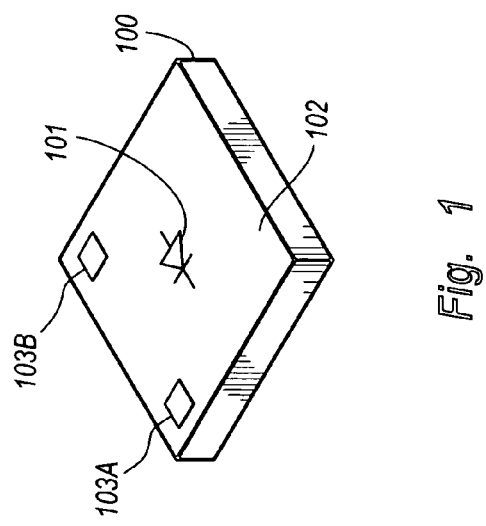
FIG. 1 illustrates a perspective view of an electro-optic transducer die, with an internal optically emissive PN junction of the electro-optic transducer die being represented by a diode symbol.

FIG. 1 illustrates a perspective view of an electro-optic transducer die 100. The electro-optic transducer die includes an optically emissive PN junction that is symbolically represented in FIG. 1 using diode symbol 101. Mechanisms for forming an optically emissive PN junction within an electro-optic transducer die are well-known in the art and thus will not be discussed here. The electro-optic transducer die 100 may be any electro-optic transducer including a laser or a Light-Emitting Diode (LED). If a laser, there is no restriction on the type of laser. Examples of lasers include edge-emitting lasers, Vertical Cavity Surface Emitting Lasers (VCSELs), and others.

There are two electrical contacts 103A and 103B patterned on the top surface 102 of the electro-optic transducer die 100 for applying a control current through the PN junction diode 101 to thereby control optical emissions from the PN junction diode 101. Of course, depending on the type of the electro-optic transducer, more or fewer electrical connections may be warranted.

Figure 2:
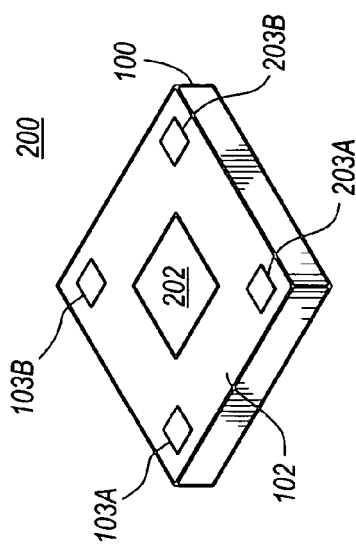
FIG. 2 illustrates a perspective view of an optical transmit assembly in accordance with a first embodiment of the present invention in which a temperature sensor is patterned on the top surface of an electro-optic transducer die.

FIG. 2 illustrates an optical transmit assembly 200 in accordance with a first embodiment of the principles of the present invention. The optical transmit assembly includes the electro-optic transducer die 100 of FIG. 1, which includes the two electrical connections 103A and 103B patterned on the top surface 102 of the electro-optic transducer die 100. Although the PN junction diode is still present within the electro-optic transducer die 100, the diode 101 is not symbolically shown in FIG. 2 so as to emphasize other features of the optical transmit assembly 200.

Specifically, a temperature sensor 202 is patterned on the top surface 102 of the electro-optic transducer die 100 shown in FIG. 2. In addition, two other 203A electrical connections 203B are for establishing any appropriate electrical connection to determine a temperature sensed by the temperature sensor 202. Of course, depending on the nature of the temperature sensor 202, more or fewer such electrical connections may be provided. The temperature sensor 202 is used to measure the temperature of the electro-optic transducer junction 101. The temperature sensor 202 may be any temperature sensor such as, for example, thermistors, thin film thermocouples, or Resistance Temperature Detectors (RTDs).

The temperature sensor 202 is closely positioned to the electro-optic transducer junction 101 since the temperature sensor 202 is patterned directly on a surface of the electro-optic transducer die 100. Accordingly, the thermal resistance between the temperature sensor 202 and the electro-optic transducer junction 101 is reduced. Accordingly, the more closely-positioned temperature sensor 202 more accurately measures the temperature of the actual electro-optic transducer junction 101. Thus, the temperature and emitted frequencies of the electro-optic transducer junction 101 may be more finely controlled.

Figure 3:
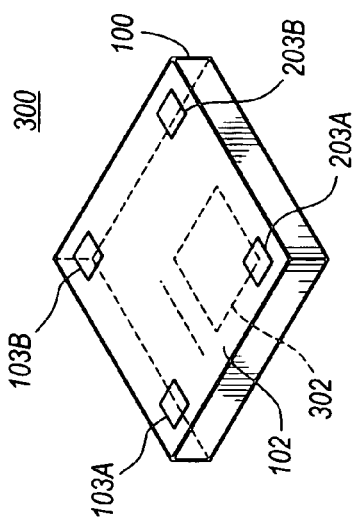
FIG. 3 illustrates a perspective view of an optical transmit assembly in accordance with a second embodiment of the present invention in which a temperature sensor is patterned on the bottom surface of an electro-optic transducer die.

FIG. 3 illustrates another embodiment of an optical transmit assembly 300 in accordance with the principles of the present invention. The optical transmit assembly 300 of FIG. 3 is structured similarly to the optical transmit assembly 200 of FIG. 2. For instance, the electro-optic transducer chip 100 of FIG. 3 has four electrical contacts patterned on its top surface for the purposes previously described. In the case of FIG. 3, however, the temperature sensor 202 is not patterned on the top surface 102 of the electro-optic transducer die 100. Instead, a temperature sensor 302 is patterned on the bottom surface of the electro-optic transducer die 100. The electrical contacts 203A and 203B may couple with the temperature sensor 302 with conductive vias, or via patterning formed on the outside of the electro-optic transducer die 100.

The example of FIGS. 2 and 3 are shown only to illustrate that the broad principles of the present invention relate generally to the patterning of a temperature sensor directly on any surface of the electro-optic transducer die, whether the patterned surfaces are the top, bottom, or other surface of the electro-optic transducer die.

FIG. 4 illustrates a profile view of the electro-optic transducer die 100 mounted on a substrate 405 for structural support. The electro-optic transducer die 100 of FIG. 4 has a temperature sensor patterned on one or more of its surfaces although the temperature sensor is not shown in FIG. 4 due to its limited profile. The temperature sensor may be patterned on the top surface (see FIG. 2), the bottom surface (see FIG. 3), and/or any other surface(s) of the electro-optic transducer die 100.

With further reference to FIG. 4, a thermo-electric cooler 407 is thermally coupled to the substrate 405. In order to allow uniform heat transfer with the lower surface of the substrate 405, a thermally conductive piece 406 may be positioned between the thermo-electric cooler 407 and the substrate 405. A heat sink 408 is thermally coupled to the thermoelectric cooler 407.

Accordingly, the principles of the present invention provide an optical transmit assembly in which the electro-optic transducer junction temperature (and thus the emitted frequency) may be tightly controlled. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired secured by United States Letters Patent is:

1. An optical transmit assembly comprising:
an electro-optic transducer die that emits light when current is passed through the electro-optic transducer die, the electro-optic transducer die including:

an optically emissive PN junction a top surface;

at least one electrical contact patterned on the top surface for applying a control current through the PN junction to control optical emissions from the PN junction;

a bottom surface;

a temperature sensor patterned directly on a surface of the electro-optic transducer die such that the temperature sensor is closely positioned to the PN junction;

one or more electrical connections patterned on a surface of the electro-optical transducer die for establishing an electrical connection to determine a temperatures sensed by the temperature sensor; and a substrate, wherein the electro-optic transducer is mounted on the substrate, wherein the surface of the electro-optic transducer to which the temperature sensor is patterned is most distant from the substrate.

2. An optical transmit assembly in accordance with claim 1, wherein the electro-optic transducer is a laser.

3. An optical transmit assembly in accordance with claim 2, wherein the laser is a Vertical Cavity Surface Emitting Laser (VCSEL).

4. An optical transmit assembly in accordance with claim 2, wherein the laser is an edge emitting laser.

5. An optical transmit assembly in accordance with claim 1, wherein the electro-optic transducer is a Light Emitting Diode (LED).

6. An optical transmit assembly in accordance with claim 1, wherein the temperature sensor is a thin film thermocouple.

7. An optical transmit assembly in accordance with claim 1, wherein the temperature sensor is a Resistance Temperature Detector (RTD).

8. An optical transmit assembly in accordance with claim 1, wherein the temperature sensor is a thermistor.

9. An optical transmit assembly comprising:

an electro-optic transducer die that emits light when current is passed through the electro-optic transducer die, the electro-optic transducer die including:

an optically emissive PN junction a top surface;

at least one electrical contact patterned on the top surface for applying a control current through the PN junction to control optical emissions from the PN junction;

a bottom surface;

a temperature sensor patterned directly on a surface of the electro-optic transducer die such that the temperature sensor is closely positioned to the PN junction;

one or more electrical connections patterned on a surface of the electro-optical transducer die for establishing an electrical connection to determine a temperatures sensed by the temperature sensor; and a substrate, wherein the electro-optic transducer is mounted on the substrate, wherein the surface of the electro-optic transducer to which the temperature sensor is patterned is most proximate to the substrate.

10. A method for manufacturing an optical transmit assembly comprising:

an act of positioning an electro-optic transducer die that emits light when current is passed through the electro-optic transducer die, the electro-optic transducer die including:

an optically emissive PN junction;

a top surface;

at least one electrical contact patterned on the top surface for applying a control current through the PN junction to control optical emissions from the PN junction;

a bottom surface;

an act of patterning a temperature sensor directly on a surface of the electro-optic transducer die such that the temperature sensor is closely positioned to the PN junction; and one or more electrical connections patterned on a surface of the electro-optic transducer die for establishing an electrical connection to determine a temperature sensed by the temperature sensor; and an act of mounting the electro-optic transducer on a substrate such that the surface to which the temperature sensor is patterned is most proximate to the substrate.

11. A method for manufacturing an optical transmit assembly in accordance with claim 10, wherein the electro-optic transducer is at least one of a laser and a Light Emitting Diode (LED).

12. A method for manufacturing an optical transmit assembly in accordance with claim 10, wherein the temperature sensor is a thin film thermocouple.

13. A method for manufacturing an optical transmit assembly in accordance with claim 10, wherein the temperature sensor is a Resistance Temperature Detector (RTD).

14. A method for manufacturing an optical transmit assembly in accordance with claim 10, wherein the temperature sensor is a thermistor.

15. A method for manufacturing an optical transmit assembly comprising:

an act of positioning an electro-optic transducer die that emits light when current is passed through the electro-optic transducer die, the electro-optic transducer die including:

an optically emissive PN junction;

a top surface;

at least one electrical contact patterned on the top surface for applying a control current through the PN junction to control optical emissions from the PN junction;

a bottom surface;

an act of patterning a temperature sensor directly on a surface of the electro-optic transducer die such that the temperature sensor is closely positioned to the PN junction; and one or more electrical connections patterned on a surface of the electro-optic transducer die for establishing an electrical connection to determine a temperature sensed by the temperature sensor;

an act of mounting the electro-optic transducer on a substrate such that the surface to which the temperature sensor is patterned is most proximate the substrate;

an act of mounting the electro-optic transducer on the substrate such that the surface of the electro-optic transducer to which the temperature sensor is patterned on is most distant from the substrate.

16. An optical transmit assembly comprising:

laser die that emits light when current is passed through the laser die, wherein the laser die is a vertical cavity surface emitting laser die or an edge emitting laser die, the laser die including:

an optically emissive PN junction;

a top surface;

at least one electrical contact patterned on a surface of the vertical cavity surface emitting laser or edge emitting laser for applying a control current through the PN junction to control optical emissions form the PN junction;
a bottom surface; and
a temperature sensor selected from the set consisting of a thermister, a thin film thermocouple, and a resistance temperature detector patterned directly on a surface of the laser die a substrate, wherein the temperature transducer is mounted on the substrate, wherein the surface of the electro-optic transducer to which the temperature sensor is patterned is most distant from, or most proximate to, the substrate.

* * * * *